(12) United States Patent
Matsuda et al.

(10) Patent No.: US 7,045,935 B2
(45) Date of Patent: May 16, 2006

(54) ACTUATOR AND LIQUID DISCHARGE HEAD, AND METHOD FOR MANUFACTURING LIQUID DISCHARGE HEAD

(75) Inventors: Takanori Matsuda, Kanagawa (JP); Kenichi Takeda, Kanagawa (JP); Toshihiro Ifuku, Kanagawa (JP); Kiyotaka Wasa, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 10/632,913

(22) Filed: Aug. 4, 2003

(65) Prior Publication Data
US 2004/0066116 A1 Apr. 8, 2004

(30) Foreign Application Priority Data
Aug. 8, 2002 (JP) .............................. 2002-231135

(51) Int. Cl.
*H01L 41/047* (2006.01)
(52) U.S. Cl. ........................................................ 310/363
(58) Field of Classification Search ................ 310/328, 310/363
See application file for complete search history.

(56) References Cited

U.S. PATENT DOCUMENTS

| | | | | |
|---|---|---|---|---|
| 5,214,738 A | * | 5/1993 | Nakajima et al. | 338/22 R |
| 5,431,958 A | | 7/1995 | Desu et al. | |
| 5,519,235 A | * | 5/1996 | Ramesh | 257/295 |
| 5,527,567 A | * | 6/1996 | Desu et al. | 427/573 |
| 6,060,735 A | * | 5/2000 | Izuha et al. | 257/295 |
| 6,113,225 A | | 9/2000 | Miyata et al. | |
| 6,231,779 B1 | * | 5/2001 | Chiang et al. | 252/62.9 R |
| 6,274,388 B1 | * | 8/2001 | Aggarwal et al. | 438/3 |
| 6,315,400 B1 | | 11/2001 | Sakai et al. | |
| 6,664,715 B1 | * | 12/2003 | Yamamoto et al. | 310/358 |
| 6,739,703 B1 | * | 5/2004 | Higuchi et al. | 347/70 |
| 6,743,292 B1 | * | 6/2004 | Jia et al. | 117/108 |
| 6,781,176 B1 | * | 8/2004 | Ramesh | 257/295 |
| 6,824,898 B1 | * | 11/2004 | Suzuki et al. | 428/701 |
| 2002/0076875 A1 | | 6/2002 | Wasa et al. | |
| 2002/0140320 A1 | | 10/2002 | Unno et al. | |
| 2004/0155559 A1 | * | 8/2004 | Ifuku et al. | 310/328 |

FOREIGN PATENT DOCUMENTS

| | | |
|---|---|---|
| JP | 6-280023 | 10/1994 |
| JP | 11-348285 | 12/1999 |

* cited by examiner

Primary Examiner—Thomas M. Dougherty
(74) Attorney, Agent, or Firm—Fitzpatrick, Cella, Harper & Scinto

(57) ABSTRACT

An actuator comprises a laminated structure having a vibration plate, a lower electrode, a piezoelectric element, and an upper electrode laminated sequentially on a basic element, and then, at least the lower electrode of the two electrodes is a thin oxide film doped with La of single orientated crystal or monocrystal that contains Sr and Ti. Thus, it is made possible to materialize the micro miniaturized actuator having a strong structure of lamination with high adhesion, which is capable of obtaining large displacement with sufficient durability without spoiling the piezo-electrostrictive property thereof even with the small thickness of the piezoelectric element. With the micro miniaturized actuator thus structured, it is made possible to make a liquid discharge head more precisely.

13 Claims, 3 Drawing Sheets

ACTUATOR AND LIQUID DISCHARGE HEAD, AND METHOD FOR MANUFACTURING LIQUID DISCHARGE HEAD

BACKGROUND OF THE INVENTION

1. Field of the Invention

The present invention relates to an actuator used for a liquid discharge head mounted on a liquid discharge recording apparatus, as well as to a liquid discharge head. The invention also relates to a method for manufacturing a liquid discharge head.

2. Related Background Art

In recent years, the printer that adopts a liquid discharge recording apparatus as the printing apparatus for a personal computer and the like has been widely used for the reasons that it has an excellent printing performance with easier handling at lower costs, among some others. For the liquid discharge recording apparatuses of the kind, there are those adopting various methods; the one that discharges liquid droplets by means of the pressure wave of the bubble, which is generated by bubbling in liquid, such as ink, by the application of thermal energy; the one that enables liquid droplets to be sucked and discharged by means of electrostatic force; and the one that utilizes the pressure wave generated by a vibrator, such as piezoelectric element, and some others. Generally, the one that uses piezoelectric element is structured with a pressure chamber communicated with a liquid supply chamber, and a liquid discharge port communicated with the pressure chamber, for example, and there is provided a vibration plate having piezoelectric element connected with the pressure chamber. Then, with the structure thus formed, the piezoelectric element is stretched and constricted by the application of a specific voltage to the piezoelectric element so as to generate straining vibrations for compressing liquid, such as ink, in the pressure chamber, thus discharging liquid droplets form the liquid discharge ports.

In recent years, color liquid discharge apparatuses have been in wide use, and along with this, it has been required to enhance the printing performance, such as higher resolution, and higher printing speed, in particular. Further, it is required to implement the elongation of liquid discharge head, necessitating the materialization of a multiple-nozzle head structure, which is a more precisely structured liquid discharge head. Then, there is a need for miniaturizing an actuator for discharging liquid in order to make the liquid discharge head more precisely. For the miniaturization of piezoelectric element and/or electrostrictive element (hereinafter referred to as a piezo-electrostrictive element), which constitutes the actuator of the liquid discharge head, it is necessary for the piezoelectric element itself to be made smaller, and then, to be provided with a high piezoelectric constant so as not to allow the driving performance thereof to be lowered even if the element is made smaller.

It is then necessary for the piezoelectric and/or electrostrictive film (hereinafter referred to as an piezo-electrostrictive film) whereby to form the piezoelectric element to be a film having an excellent crystallinity. The film that has the excellent crystallinity is a thin film of the single-orientated crystal, which is orientated in one and the same direction or the monocrystal having in-plane orientation. Also, to make the piezo-electrostrictive film of monocrystal, it is desirable that the immediate layer is monocrystal or the like when manufacturing the piezo-electrostrictive film, and the combination of the piezo-electrostrictive film and the material of the immediate layer should be given an excellent lattice matching.

However, for the piezo-electrostrictive film used for the conventional piezo-electrostrictive element, it is difficult to form the piezo-electrostrictive film thinner than 10 μm, for example, because the adopted method of the film formation is such that the powered paste of PbO, $ZrO_2$, and $TiO_2$ is processed to be a sheet (green sheet) by molding, and after that, the sheet is sintered for the film formation. Also, the sintering of the green sheet is performed at a temperature of 1,000° C. or more. As a result, a problem is encountered that the piezo-electrostrictive material is contracted almost to 70% unavoidably. Under such circumstances, it is difficult to position the piezo-electrostrictive element and the structures, such as the liquid chamber and the pressure chamber, together in a high precision of several-micron order. It is, therefore, difficult to miniaturize the actuator.

Also, the ceramics piezo-electrostrictive film, which is formed by sintering the green sheet, the influence of the grain boundary becomes no longer negligible as the thickness thereof is made smaller. It is then difficult to obtain any good piezo-electrostrictive property. In other words, for the piezo-electrostrictive film obtained by sintering the green sheet, there is a problem that it is difficult to obtain any sufficient piezo-electrostrictive property for discharging recording liquid if the thickness thereof becomes less than 10 μm. Under the circumstances, it has been difficult to materialize a small liquid discharge head having the characteristics needed for discharging recording liquid sufficiently.

Also, as the method of manufacture of the piezo-electrostrictive film, which has been reported up to the present, there are CVD method, Sol-Gel method, and others. The density of piezo-electrostrictive film manufactured by these methods also tends to be lowered to make the micro processing thereof difficult. The piezoelectric constant that indicates the capability of the piezo-electrostrictive material is small, too. Therefore, the displacement amount becomes small against a constant voltage accordingly when it is miniaturized. Thus, it is difficult to adopt the aforesaid CVD method and the like for manufacturing a small actuator and the piezo-electrostrictive film for a liquid discharge head.

Further, with respect to the conventional art, a problem is encountered that the adherence is made lower between metallic electrodes and the piezo-electrostrictive element, which is oxide. There is a need for the provision of high adherence between the electrodes and piezo-electrostrictive film in order to withstand the stress that occurs by the repeated driving when acting as an actuator and piezo-electrostrictive element for a liquid discharge head.

Also, the structure of a liquid discharge head manufactured by the micro processing of semiconductor process using sputtering method, and the method of manufacture therefor have been proposed in the specification of Japanese Patent Application Laid-Open No. 11-348285. This liquid discharge head is characterized in that on the mono-crystal MgO, platinum is orientated for the film formation, and further, thereon, the perovskite layer that does not contain Zr layer, and the PZT layer are formed as a laminated element.

However, with the method of manufacture disclosed in the specification of the aforesaid laid-open paten application, it is difficult to obtain the single-orientated crystal, which is stabilized with good reproducibility or monocrystal PZT. Further, it is impossible to obtain the PZT layer unless it is orientated on an extremely expensive monocrystal substrate, such as monocrystal MgO. The process becomes extremely expensive unavoidably. Further, there is a limit to the size of the MgO mono-crystal substrate to make it difficult to obtain the substrate having a large area.

In this respect, as the oxide electrode material, there is a disclosure of the element that uses $SrRuO_3$ in the specification of Japanese Patent Application Laid-Open No. 06-280023. However, in this specification of patent application, there is no disclosure that $SrRuO_3$ is a crystal having single-orientation or monocrystal, and the thin oxide piezo-electrostrictive film, which should be formed on the upper part, cannot become a crystal having single-orientation or a monocrystal.

SUMMARY OF THE INVENTION

One of the object of the present invention is to provide an actuator capable of materializing a stable and highly reliable liquid discharge head having liquid discharge ports formed in high density by the use of a high-strength laminated structure containing a thinner piezo-electrostrictive film having sufficient piezo-electrostrictive property, which makes it possible to perform the micro processing generally used for the semiconductor process, as well as to provide such liquid discharge head, and a method for manufacturing the liquid discharge head.

It is another object of the invention to provide a method for manufacturing a liquid discharge head capable of forming a piezo-electrostrictive film of single orientated crystal or monocrystal stably with good reproducibility.

It is still another object of the invention to provide an actuator having a piezo-electrostrictive element with large displacement amount and high adhesion between a piezo-electrostrictive film and electrodes, and also, to provide a liquid discharge head, and a method for manufacturing the liquid discharge head.

It is a further object of the invention to provide an actuator comprising a laminated structure having a vibration plate, a lower electrode, a piezoelectric element, and an upper electrode laminated sequentially on a basic element, in which at least the lower electrode of the two electrodes is a thin oxide film of La doped single orientated crystal or monocrystal containing Sr and Ti.

It is still a further object of the invention to provide a liquid discharge head having the main body portion with pressure chamber communicated with liquid discharge port, and an actuator provided on the main body portion corresponding to the pressure chamber, in which the actuator comprises a laminated structure having a vibration plate, a lower electrode, a piezoelectric element, and an upper electrode laminated sequentially on a basic element, and then, at least the lower electrode of the two electrodes is a thin oxide film of La doped single orientated crystal or monocrystal containing Sr and Ti.

It is still another object of the invention to provide a method for manufacturing a liquid discharge head provided with the main body portion having pressure chamber communicated with liquid discharge port, and an actuator provided on the main body portion corresponding to the pressure chamber, comprising the steps of filming a vibration plate on the main body portion; filming on the vibration plate a lower electrode of thin oxide film of La doped single orientated crystal or monocrystal containing La doped Sr and Ti; filming on the lower electrode a perovskite type thin oxide piezo-electrostrictive film; filming an upper electrode on the perovskite type thin oxide piezo-electrostrictive film; and forming the pressure chamber.

When the piezoelectric element of the actuator is formed by the oxide piezo-electrostrictive film of single orientated crystal or monocrystal, which is thin but provides excellent piezo-electrostrictive property, it becomes possible to perform micro processing by use of the semiconductor process. For the manufacture of such thin oxide piezo-electrostrictive film of single orientated crystal or monocrystal stably and in good reproducibility, a thin oxide film of La doped single orientated crystal or monocrystal, which contains Sr and Ti, is used to form the lower electrode that becomes the layer thereof when being filmed. The electrode of thin oxide film doped with La of single orientated crystal or monocrystal containing Sr and Ti has good lattice controllability with the oxide piezo-electrostrictive material that forms the piezo-electric element. Therefore, it is made possible to form on the lower electrode the piezo-electrostrictive film of single orientated crystal or monocrystal having the crystal orientation ratio of 90% or more.

Also, when both of two electrodes bonded to the piezo-electric element are those of the thin oxide film having high crystallinity as described above, the strength of the two electrodes, upper and lower, themselves are made high, and also, the adhesion thereof becomes excellent with respect to the piezoelectric element, which significantly contributes to the reinforcement of strength and the enhancement of durability of the laminated structure that forms the actuator.

Then, when the piezoelectric element having sufficient piezo-electrostrictive property is formed to be a highly strong laminated structure, which is filmed in a small thickness of 10 µm or less, for example, the micro processing using the semiconductor process becomes applicable to the manufacture of the actuator, hence making it possible to promote the miniaturization of the actuator, and the provision of a liquid discharge head in high density, as well as the higher performance thereof.

For the present invention, the thin oxide film doped with La of single orientated crystal or monocrystal containing Sr and Ti is used as the lower electrode. As a result, it becomes possible to epitaxially develop on the lower electrode the piezo-electrostrictive film of perovskite type or the like stably and in good reproducibility. With the lamination of such piezoelectric element and electrodes of thin oxide film of single orientated crystal or monocrystal, it becomes possible to materialize the micro miniaturized actuator having a strong structure of lamination with high adhesion, which is capable of obtaining large displacement with sufficient durability without spoiling the piezo-electrostrictive property even with the small thickness of the piezoelectric element. By use of such actuator it is possible to materialize a high-performance liquid discharge head in extremely high density.

DETAILED DESCRIPTION OF THE PREFERRED EMBODIMENTS

Hereinafter, with reference to the accompanying drawings, the description will be made of one embodiment in accordance with the present invention.

Figure 1:
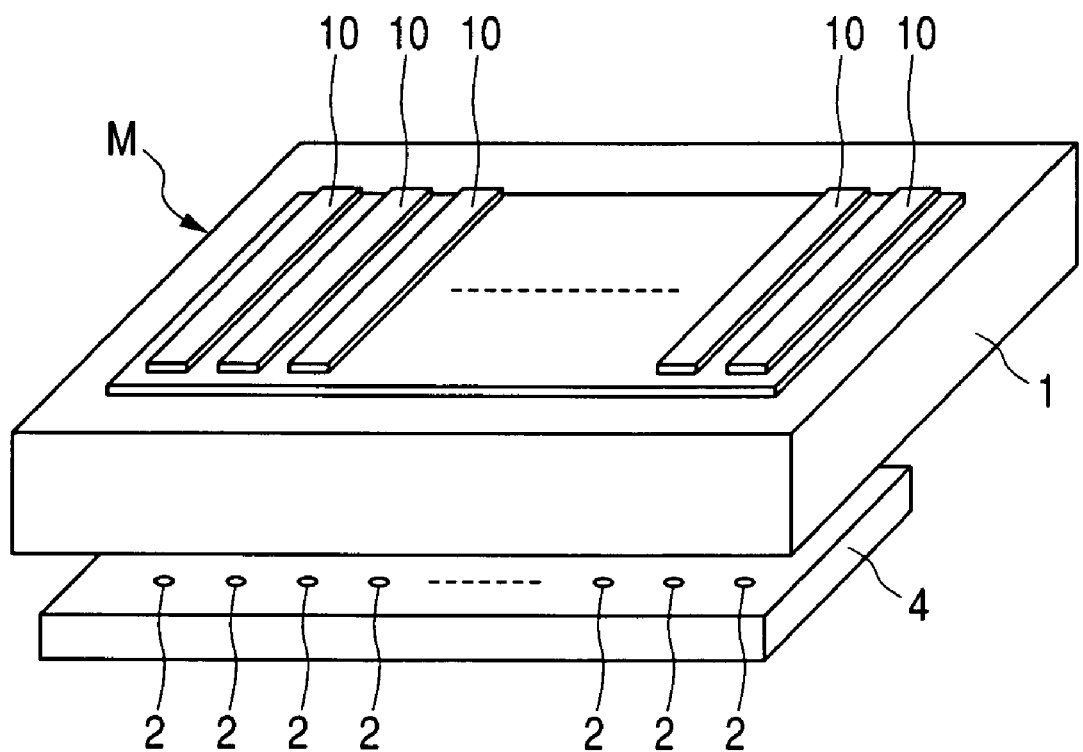
FIG. 1 is a perspective view that schematically shows a liquid discharge head in accordance with one embodiment of the present invention.
Figure 2:
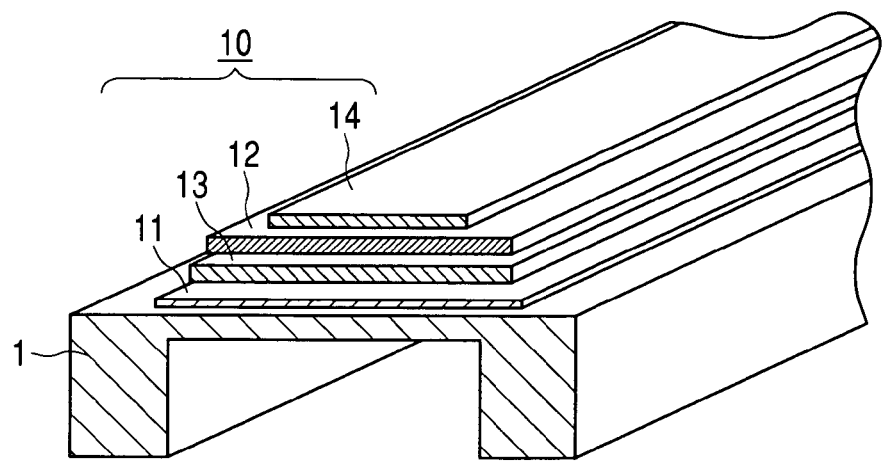
FIG. 2 is a perspective view that schematically shows an actuator used for the liquid discharge head represented in FIG. 1.
Figure 3:
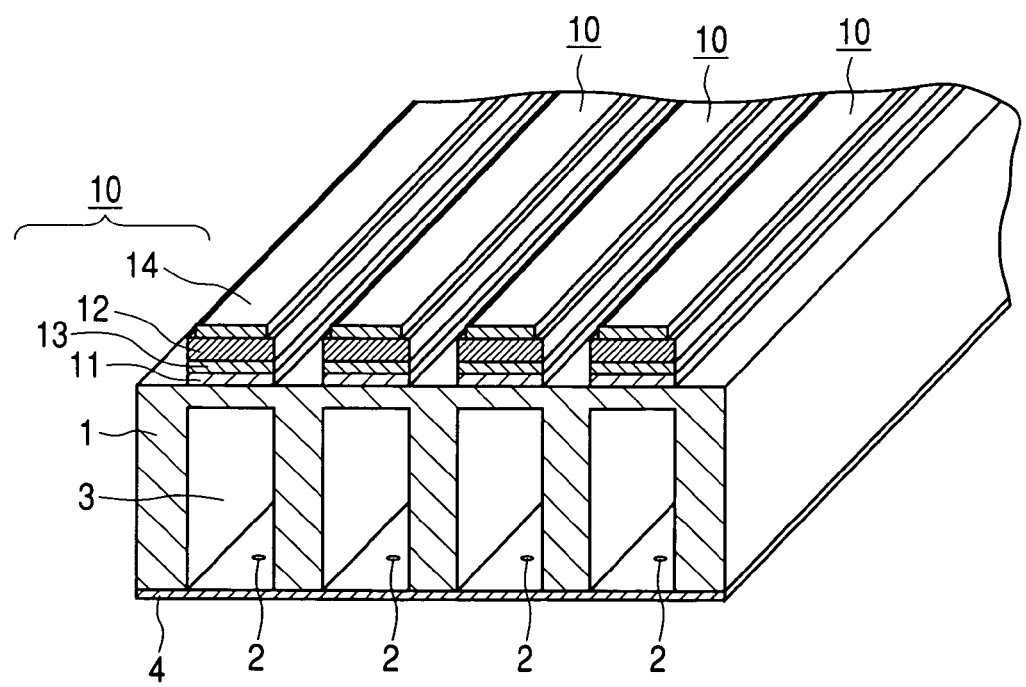
FIG. 3 is a partially broken perspective view that shows the sectional structure of the liquid discharge head represented in FIG. 1.

FIGS. 1, 2 and 3 illustrate a liquid discharge head embodying the present invention. The liquid discharge head M comprises the main body base plate portion 1, which serves as the basic element; plural discharge ports (nozzles) 2; plural pressure chambers (liquid chambers) 3 provided for each of the liquid discharge ports 2; and the actuator 10, which is arranged corresponding to each of the pressure chambers 3, respectively. The liquid discharge ports 2 are formed for a nozzle plate 4 at predetermined intervals. The pressure chambers 3 are formed in parallel on the main body basic plate portion 1 corresponding to the liquid discharge ports 2, respectively. Here, for the present embodiment, the liquid discharge ports 2 are arranged on the lower face side. However, these ports may be arranged on the side face side.

On the upper face of the main body base plate portion 1, each opening (not shown) is formed for each of the pressure chambers 3 correspondingly, and each of the actuators 10 is positioned to close such opening. Each of the actuators 10 comprises a vibration plate 11 formed by thin oxide film; a piezoelectric element (piezo-electrostrictive film) 12; and the lower electrode 13 and upper electrode 14, which are formed by thin oxide film, respectively.

Of the aforesaid two electrodes 13 and 14, at least the lower electrode 13, which lies between the vibration plate 11, and the piezoelectric element 12, which is the thin oxide piezo-electrostrictive film, is the electrode formed by thin oxide film of single-orientated crystal or monocrystal that contains La doped Sr and Ti and presents good lattice controllability with respect to both the thin oxide film of the vibration plate 11 and the thin oxide piezo-electrostrictive film.

For the present embodiment, the thin oxide film electrode is used at least for the lower electrode. Therefore, the strength of the electrode itself, and the adhesion with the vibration plate formed by thin oxide film can be kept even if the mechanical displacements are repeated and minute cracks are generated. Also, with the selected electrode material, which presents good matching of lattice constant both with the vibration plate and the thin oxide piezo-electrostrictive film, the adhesive force is not deteriorated, hence making it possible to materialize the microminiaturized piezo-electrostrictive element (actuator) having excellent durability.

In addition, on the lower layer of the thin oxide piezo-electrostrictive film that forms the piezoelectric element, the electrode, which is a single-oriented crystal or monocrystal with good lattice matching with the thin oxide piezo-electrostrictive film, is arranged to exist inclusively. Then, it is made possible to obtain the single-orientated crystal or monocrystal piezo-electrostrictive film with high ratio of crystal orientation stably and in good reproducibility.

Further, the vibration plate and piezoelectric element, and both electrodes, which are laminated on the basic element, are formed one after another by the film having uniform crystal orientation. In this way, it is made possible to minimize the variations in the actuator performance per nozzle in the case of a liquid discharge head, and also, to obtain a device having a strong adhesion.

As described above, in the laminated structure of a single orientated crystal or monocrystal containing an upper electrode, a piezoelectric element, a lower electrode, and a vibration plate, in which at least the lower electrode of the aforesaid two electrodes contains a chemical element containing La doped Sr and Ti, it is preferable to keep the concentration of the La, which is doped in the aforesaid electrode of thin oxide film, within a range of 0.05 atm % to 10 atm %.

The crystallinity of the electrode of thin oxide film the La concentration of which is 0.05 atm % to 10 atm % tends to be deteriorated as the La concentration increases. However, with the increased La concentration, the conductance can be made larger from $1 \times 10^3$ (S/cm) to $1 \times 10^5$ (S/cm). Therefore, it is preferable to keep the La concentration doping within a range of 0.05 atm % to 10 atm %.

Also, it is preferable to keep the lattice constant of the La doped electrode of thin oxide film within a range of 3.905 Å to 4.030 Å. As the La concentration is increased from 0.05% to 10%, the lattice constant of the electrode of thin oxide film becomes larger from 3.905 Å to 4.030 Å, and the lattice constant of the electrode of thin oxide film can be made to match with a desired lattice constant, which is closest to the lattice constant of the piezo-electrostrictive film to be formed thereon.

Also, it is preferable to keep the film thickness of the aforesaid electrode of thin oxide film within a range of 50 nm to 5,000 nm. It is more preferable to keep it within a range of 100 nm to 2,000 nm. If the film thickness of the electrode of thin oxide film is less than 50 nm, it is impossible to secure sufficient conductance for the lower electrode. Also, if it is more than 5,000 nm, the surface roughness of the electrode of thin oxide film is large, which requires the mechanical polishing process. Then, there is a possibility that the crystallinity and the conductance of the electrode of thin oxide film are deteriorated.

Also, preferably, the crystal orientations of the substrate surface of the aforesaid electrode of thin oxide film are (010), (101), (110), and (111). Then, When the crystal orientations of the substrate surface of the electrode of thin oxide film serving as the lower electrode are (010), (101), (110), and (111), the piezo-electrostrictive film, which is formed on the upper part, is epitaxially developed to make the crystal orientations of the piezo-electrostrictive film (100), (001), (010), (101), (110), and (111), respectively. In this respect, the piezo-electrostrictive property of the piezo-electrostrictive film is particularly excellent when the crystal orientations are (001) and (111).

Also, preferably, the crystal orientation ratio of the aforesaid electrode of thin oxide film is 90% or more. The crystal orientation ratio means a ratio at the peak strength ratio of the film obtainable by means of the θ–2θ measurement of XRD (X ray analysis). When the crystal orientation ration of the electrode of thin oxide film is less than 90%, not only the good electrical property is impeded, but also, there is a possibility that the crystallinity of the piezo-electrostrictive film formed on the upper part is deteriorated, because there exists the crystal, which is provided with other orientations of more than 10%, or different phase. More preferably, therefore, the crystal orientation ratio should be 95% or more for the electrode of thin oxide film, which serves as the lower part electrode.

The piezo-electrostrictive film that forms the piezoelectric element should desirably be the thin oxide film of single-orientated crystal or monocrystal, which contains Pb, and at least one kind of atom from among Zr, Ti, Ni, Nb, Mg, Zn, and Sc.

As the material of the thin oxide piezo-electrostrictive film (piezo-electrostrictive film) of single-orientated crystal or monocrystal, which is used for the present invention, the following can be selected, for example:

PZT [Pb($Zr_x Ti_{1-x}$)$O_3$],
PMN [Pb($Mg_x Nb_{1-x}$)$O_3$],
PNN [Pb($Nb_x Ni_{1-x}$)$O_3$],
PSN [Pb($Sc_x Nb_{1-x}$)$O_3$],
PZN [Pb($Zn_x Nb_{1-x}$)$O_3$],
PMN-PT {(1−y)[Pb($Mg_x Nb_{1-x}$)$O_3$]-y[Pb$TiO_3$]},
PSN-PT {(1−y)[Pb($Sc_x Nb_{1-x}$)$O_3$]-y[Pb$TiO_3$]},
PZN-PT {(1−y)[Pb($Zn_x Nb_{1-x}$)$O_3$]-y[Pb$TiO_3$]}

Here, the x and y are numbers less than 1 and more than 0. For example, in the case of PZT, preferably, the x is 0.3 to 0.7, that of PMN, x is 0.2 to 0.5, and that of PSN, x is 0.4 to 0.7. Also, preferably, the y for PMN-PT is 0.2 to 0.4, the y for PSN-PT is 0.35 to 0.5, and the y for PZN-PT is 0.03 to 0.35.

The thin oxide piezo-electrostrictive film of single orientated crystal or monocrystal may be a single composition or a combination of two or more kinds. Also, the film may be a composition formed by doping a minute quantity of atom in the aforesaid main component.

Then, preferably, the crystal orientation ratio of the aforesaid piezo-electrostrictive film is 90% or more. If the crystal orientation ratio of the piezo-electrostrictive film is less than 90%, there exists the crystal, which is provided with other orientations of more than 10%, or different phase, and it may cause the piezo-electrostrictive property of the actuator to be deteriorated.

Also, the crystalline system of the thin oxide piezo-electrostrictive film of single orientated crystal or monocrystal should preferably be rhombohedral or tetragonal. In other words, there is a need for the piezo-electrostrictive film of single orientated crystal or monocrystal to be of the rhombohedral or tetragonal system to obtain the piezo-electrostrictive property good enough to provide the function to drive the actuator and liquid discharge head sufficiently.

The film thickness of the piezo-electrostrictive film of single orientated crystal or monocrystal should preferably be 100 nm or more and 10 μm or less. The material of the piezo-electrostrictive film of single orientated crystal or monocrystal needs to be the one that can withstand the stress generated by the repeated driving when it is used for the actuator and liquid discharge head. If the film thickness of the piezo-electrostrictive film of single orientated crystal or monocrystal is leas than 100 nm, there is a possibility that it is broken due to defects when repeatedly driven. More preferably, the film thickness thereof should be 500 nm or more and 8 μm or less.

Now, the specific layer structures of the actuator that uses the aforesaid electrode of thin oxide film of single orientated crystal or monocrystal as the lower electrode in accordance with the present invention are listed below. The indication of the layer structure is: upper electrode//piezo-electrostrictive film//lower electrode/vibration plate in that order.

EXAMPLE 1

Pt/Ti//PZT(001)//La-STO(100)//YSZ(111)/Si(111)

EXAMPLE 2

Au//PZT(001)//La-STO(100)//YSZ(111)/Si(111)

EXAMPLE 3

La-STO(100)//PZT(001)//La-STO(100)//YSZ(111)/Si(111)

EXAMPLE 4

Pt/Ti//PZT(001)//La-STO(100)/Si(111)

EXAMPLE 5

Au//PZT(001)//La-STO(100)/Si(111)

EXAMPLE 6

La-STO(100)//PZT(001)//La-STO(100)/Si(111)

EXAMPLE 7

Pt/Ti//PZT(111)//La-STO(111)//YSZ(100)/Si(100)

EXAMPLE 8

Au//PZT(111)//La-STO(111)//YSZ(100)/Si(100)

EXAMPLE 9

La-STO(111)//PZT(111)//La-STO(111)//YSZ(100)/Si(100)

EXAMPLE 10

Pt/Ti//PZT(111)//La-STO(111)//Si(100)

EXAMPLE 11
Au//PZT(111)//La-STO(111)//Si(100)

EXAMPLE 12
La-STO(111)//PZT(111)//La-STO(111)//Si(100)

For the specific examples listed above, the laminated layer structure of PZT or PZT/PT is exemplified for the piezo-electrostrictive film. However, it may be the layer structure in which these are appropriately modified to the aforesaid PMN, PZN, PSN, PNN, PMN-PT, PSN-PT, or PZN-PT. For example:
Pt/Ti//PMN(001)/PT(001)//La-STO(100)//YSZ(100)/Si (100),
Au//PMN-PT(001)//La-STO(100)//YSZ(100)/Si(100),
La-STO(100)//PMN-PT(001)/PT(001)//La-STO(100)//YSZ (100)/Si(100) and others.

Here, the crystal orientations indicated in ( ) are those of preferred orientations described earlier.

The method for manufacturing the liquid discharge head described above comprises the steps of filming the vibration plate on the Si substrate that constitutes the main body basic element; filming the aforesaid electrode of thin oxide film on the vibration plate as the lower electrode; filming the piezo-electrostrictive film of perovskite type on the electrode of thin oxide film; filming the upper electrode on the piezo-electrostrictive film of perovskite type; forming the pressure chamber on the Si substrate; and bonding the nozzle plate having discharge ports formed therefor to the pressure chamber.

The filming process of the electrode of thin oxide film doped with La is to epitaxially develop the thin oxide film, which contains Sr and Ti by use of sputtering method, MOCVD method, Sol-Gel method, MBE method, hydrothermal synthesis method, or the like.

The filing process of the piezo-electrostrictive film of perovskite type on the electrode of thin oxide film is to epitaxially develop the piezo-electrostrictive material of perovskite type by use of sputtering method, MOCVD method, Sol-Gel method MBE method, hydrothermal synthesis method, or the like.

The filming process of the upper electrode on the piezo-electrostrictive film of perovskite type is to execute filming by use of vapor method, such as sputtering method, vapor deposition method or liquid method, such as plating method.

The forming process of the pressure chamber on the Si substrate is to form the pressure chamber on the Si substrate by use of the wet etching, which utilizes the anisotropic etching, or dry etching such as ICP, legal process, Bosch process. Also, the shape of the pressure chamber can be selected from among rectangle, Circle, oblong, or the like. Also, in a case of side shooter, the sectional shape of the pressure chamber may be such as to make it narrower in the nozzle direction.

The process of bonding the pressure chamber to the nozzle plate having discharge ports formed therefor is to bond the nozzle plate having nozzles provided therefor to each of the pressure chamber portion correspondingly. Also, the nozzle may be formed by resist material or the like. Also, the nozzle may be formed by laser process corresponding to each pressure chamber after the polymer base plate has been bonded.

With the actuator of the present embodiment, it is possible to materialize a fine liquid discharge head having large discharging power to deal with high frequency, because the piezo-electrostrictive film that forms the piezoelectric element is single orientated crystal or monocrystal.

Next, the embodiments will be described.

FIRST TO FOURTH EMBODIMENTS

Figure 4:
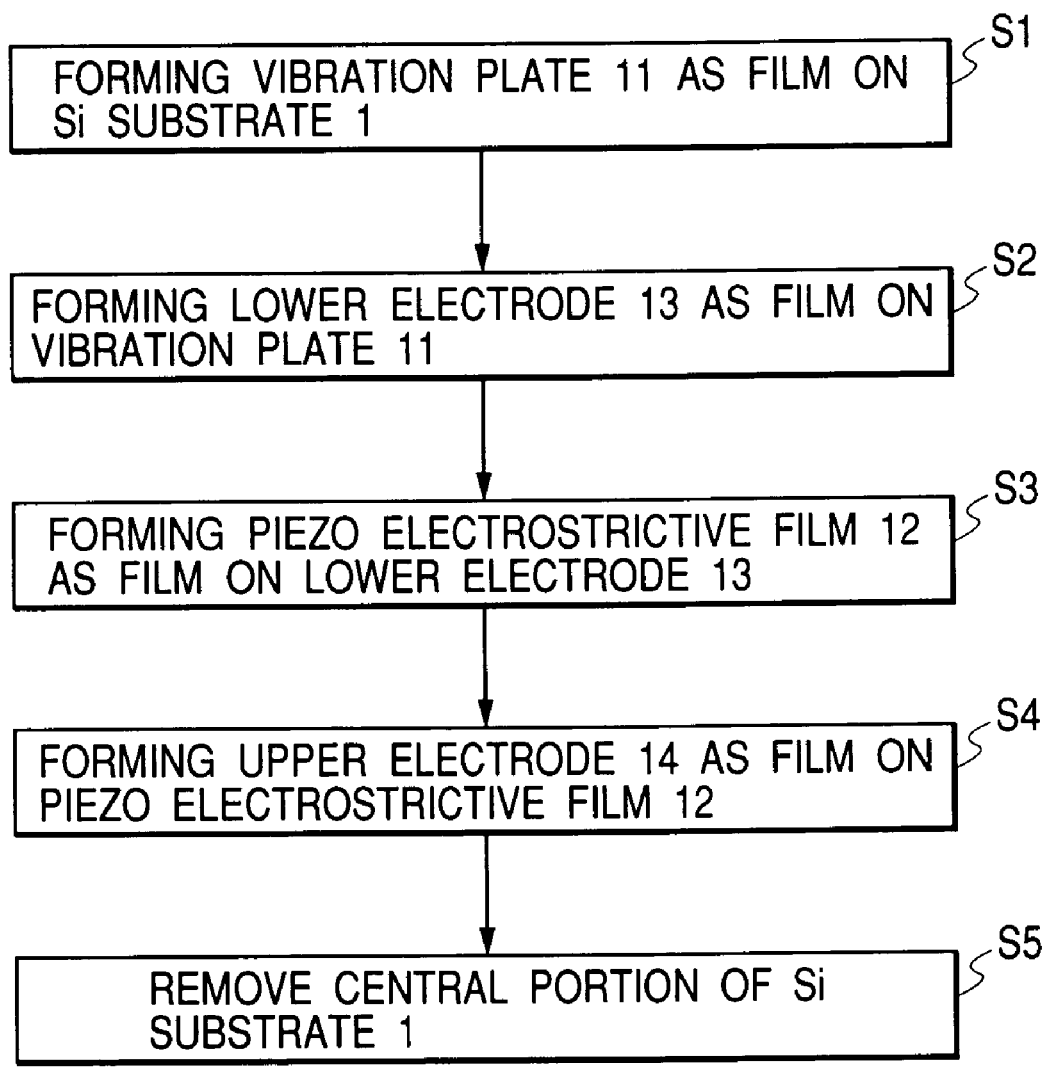
FIG. 4 is a view that shows the manufacturing process of the liquid discharge head in accordance with one embodiment of the present invention.

For the actuator structured as shown in FIG. 2, the La doping concentration in the SrTiO$_3$ lower electrode is arranged to be 0.08%, 0.80%, 8.00%, and 0.04%, and then, in accordance with the manufacturing steps shown in FIG. 4, actuators of first, second, third, and fourth embodiment are manufactured.

The method of manufacture is as follows:

At first, a vibration plate is filmed on Si substrate by sputtering method (S1). At this juncture, the substrate is heated to form the film, while keeping the temperature at 500° C. or more. Thus, the vibration plate is epitaxially developed to make it monocrystal or single orientated one. Further, with the same method, the lower electrode is filmed on the vibration plate (S2) to make it possible to obtain the electrode of thin oxide film of monocrystal or single orientated crystal. Then, with the same method, the piezo-electrostrictive film is formed on the lower electrode (S3) to make it possible to obtain the piezoelectric element (PZT) formed by thin film of monocrystal or single orientated crystal. The upper electrode is also filmed in the same way (S4). Then, the rear and central parts of the Si substrate, which serves as the basic element, are removed by wet anisotropic etching (S5), thus manufacturing the actuator shown in FIG. 2.

Table 1 shows the relations of the lattice constant of La-STO and the La doping concentration to the SrTiO$_3$ (STO) that forms the lower electrode; the relations with the orientation ratio of PZT, which is the piezoelectric element; and PZT crystalline system. The structure and film thickness of each layer of the first, second, third, and fourth embodiments are as follows. In this respect, the indication in ( ) is preferred direction of orientation, and the indication in [ ] is the film thickness, respectively.

Upper electrode Pt [0.25 μm]/Ti [0.05 μm]//piezo-electrostrictive film PZT (001) [3 μm]//lower electrode La-STO (100) [0.05 μm]//vibration plate YSZ (100) [2 μm]/substrate Si (100) [600 μm]

TABLE 1

|  | La-STO La doping concentration (%) | La-STO Lattice constant (A) | PZT orientation ratio (001) (%) | PZT Crystalline system |
| --- | --- | --- | --- | --- |
| Embodiment 1 | 0.08 | 3.923 | 93 | tetragonal |
| Embodiment 2 | 0.80 | 3.941 | 94 | tetragonal |
| Embodiment 3 | 8.00 | 4.021 | 99 | tetragonal |
| Embodiment 4 | 0.04 | 3.911 | 89 | tetragonal |

From the relations of the changes in the La doping concentration in SrTiO$_3$ and the lattice constants of the La-STO shown in the Table 1, it is understood that with the increases in the La doping concentration, the lattice constant of La-STO becomes larger. Further from the relations of the changes in the La doping concentration and the PZT orientation ratio, it is understood that with the increases in the La doping concentration, the orientation ratio becomes larger. Also, when the La doping concentration is 0.04%, which is less than 0.05%, the orientation ratio is 89%, which is less than 90%. Also, the crystalline systems are all tetragonal.

In Table 2, the displacement amounts are shown at the time of applying 20 V to each of the actuators. For this Table, it is understandable that the displace amount of the first embodiment having the La doping concentration of 0.08% is 278 nm. Likewise, that of the second embodiment of 80% is 469 nm. That of the third embodiment of 8.0% is 378 nm. Also, the displacement amount of the fourth embodiment having the La doping concentration of 0.04%, which is less than 0.05% is 42 nm by the application of 20 V. There is a need for the application of 60 V thereto in order to obtain substantially the same displacement amount of the first to third embodiments. When 60 V is applied, the displacement amount thereof is 312 nm.

TABLE 2

|  | Displacement amount (nm) |
| --- | --- |
| Embodiment 1 | 278 |
| Embodiment 2 | 469 |
| Embodiment 3 | 378 |
| Embodiment 4 | 42 |
| Embodiment 4 | 312 (60 V (10 kHz) applied) |

FIFTH TO EIGHTH EMBODIMENTS

Using the actuators of the first, second, third, and fourth embodiments liquid discharge heads each having the structure as shown in FIG. 3 are manufactured, and adopted as the fifth, sixth, seventh, and eight embodiments, respectively.

The film thickness of each film is arranged as described earlier, and the upper electrode is 0.3 μm/the piezo-electrostrictive film, 3 μm/the lower electrode, 0.5 μm/the vibration plate, 2 μm/the substrate 600 μm. Also, in order to implement the 180 dpi, the width of the pressure chamber is arranged to be 90 μm, and the width of pressure chamber wall is 50 μm.

The Table 3 shows the discharge amount of liquid droplet and discharge speed of each of the liquid discharge heads at the time of applying 20 V at 10 kHz.

TABLE 3

|  | Discharge amount (pl) | Discharge speed (m/sec) |
|---|---|---|
| Embodiment 5 | 12 | 12 |
| Embodiment 6 | 17 | 14 |
| Embodiment 7 | 15 | 13 |
| Embodiment 8 | 8 | 8 |
| Embodiment 8 | 12 (60 V (10 kHz) applied) | 12 (60 V (10 kHz) applied) |

With the liquid discharge heads of the fifth to seventh embodiments, it is possible to obtain the discharge amounts of 12 to 17 pl, and the discharge speeds of 12 to 14 m/sec, respectively.

Also, when 20 V is applied to the liquid discharge head of the eighth embodiment having the actuator, the La doping concentration of the lower electrode of which is 0.04%, that is, less than 0.05%, the discharge amount is 8 pl, and the discharge speed is 8 m/sec. These values are smaller than the discharge amounts and discharge speeds obtainable by the fifth to seventh embodiments. There is a need for the application of 60 V for the liquid discharge head of the eighth embodiment in order to obtain substantially the same discharge amount and discharge speed as those of the fifth to seventh embodiments. When 60 V is applied, the discharge amount thereof is 12 pl, and the discharge speed, 12 m/sec.

What is claimed is:

1. An actuator comprising:
   a laminated structure having a vibration plate, a lower electrode, a piezoelectric element, and an upper electrode laminated sequentially on a basic element,
   wherein at least said lower electrode of said two electrodes is an La-doped single orientated crystal or monocrystal oxide film containing Sr and Ti, in which La, Sr and Ti are contained in a common layer.

2. An actuator according to claim 1, wherein the piezoelectric element is a thin oxide piezo-electrostrictive film of single orientated crystal or monocrystal.

3. An actuator according to claim 1, wherein the La doping concentration in the single orientated crystal or monocrystal oxide film is within a range of 0.05 atm % to 10 atm %.

4. An actuator according to claim 1, wherein the lattice constant of the single orientated crystal or monocrystal oxide film is within a range of 3.905 Å to 4.030 Å.

5. An actuator according to claim 1, wherein the film thickness of the single orientated crystal or monocrystal oxide film is within a range of 50 nm to 5,000 nm.

6. An actuator according to claim 1, wherein the crystal orientation of the single orientated crystal or monocrystal oxide film is one of (010), (101), (110), and (111).

7. An actuator according to claim 1, wherein the crystal orientation ratio of the single orientated crystal or monocrystal oxide film is 95% or more.

8. An actuator according to claim 1, wherein the piezoelectric element is a thin oxide piezo-electrostrictive film of single orientated crystal or monocrystal containing Pb, and at least one of Zr, Ti, Ni, Nb, Mg, Zn, and Sc.

9. An actuator according to claim 8, wherein the crystal orientation ratio of the thin oxide piezo-electrostrictive film of single orientated crystal or monocrystal is 90% or more.

10. An actuator according to claim 8, wherein the crystalline system of the thin oxide piezo-electrostrictive film of single orientated crystal or monocrystal is rhombohedral or tetragonal.

11. An actuator according to claim 8, wherein the film thickness of the thin oxide piezo-electrostrictive film of single orientated crystal or monocrystal is 500 nm or more and 10 μm or less.

12. A liquid discharge head provided with a main body portion having the actuator according to claim 1, and a pressure chamber formed with an opening portion on a part thereof, and communicated with a liquid discharge port, wherein said actuator is provided on said pressure chamber so as to close said opening portion.

13. A liquid discharge head provided with a main body portion having a pressure chamber communicated with a liquid discharge port, and an actuator provided on said main body portion corresponding to said pressure chamber,
   wherein said actuator comprises a laminated structure having a vibration plate, a lower electrode, a piezoelectric element, and an upper electrode laminated sequentially on said main body portion, and at least said lower electrode of said two electrodes is an La-doped single orientated crystal or monocrystal oxide film containing Sr and Ti, in which La, Sr and Ti are contained in a common layer.

* * * * *

UNITED STATES PATENT AND TRADEMARK OFFICE
CERTIFICATE OF CORRECTION

PATENT NO. : 7,045,935 B2
APPLICATION NO. : 10/632913
DATED : May 16, 2006
INVENTOR(S) : Takanori Matsuda et al.

It is certified that error appears in the above-identified patent and that said Letters Patent is hereby corrected as shown below:

COLUMN 1
Line 59, "an" should read --a--.

COLUMN 2
Line 19, "the" should read --in the--.
Line 57, "mono-crystal" should read --monocrystal--.
Line 62, "paten" should read --patent--.

COLUMN 3
Line 2, "mono-crystal" should read --monocrystal--.
Line 16, "object" should read --objects--.

COLUMN 6
Line 36, "When" should read --when--.
Line 50 "ration" should read --ratio--.

COLUMN 9
Line 1, "filing" should read --filming--.
Line 5, "method MBE" should read --method, MBE.--
Line 14, "legal" should read --etching--.
Line 16, "Circle," should read --circle,--.
Line 23, "portion" should read --portions--.
Line 40, "embodiment" should read --embodiments--.

UNITED STATES PATENT AND TRADEMARK OFFICE
CERTIFICATE OF CORRECTION

PATENT NO. : 7,045,935 B2
APPLICATION NO. : 10/632913
DATED : May 16, 2006
INVENTOR(S) : Takanori Matsuda et al.

It is certified that error appears in the above-identified patent and that said Letters Patent is hereby corrected as shown below:

COLUMN 10
Line 32, "displace" should read --displacement--.
Line 59, "eight" should read --eighth--.

Signed and Sealed this

Thirtieth Day of January, 2007

JON W. DUDAS
*Director of the United States Patent and Trademark Office*